United States Patent [19]
Sandhu et al.

[11] Patent Number: 6,040,020
[45] Date of Patent: Mar. 21, 2000

[54] METHOD OF FORMING A FILM HAVING ENHANCED REFLOW CHARACTERISTICS AT LOW THERMAL BUDGET

[75] Inventors: Gurtej Sandhu; Randhir P. S. Thakur, both of Boise, Id.

[73] Assignee: Micron Technology, Inc., Boise, Id.

[21] Appl. No.: 08/512,234

[22] Filed: Aug. 7, 1995

[51] Int. Cl.[7] ..................................................... B32B 17/00
[52] U.S. Cl. ..................... 427/557; 427/249.5; 427/250; 427/255.18; 427/255.21; 427/376.2; 427/527; 427/531
[58] Field of Search ................... 427/248.1, 255.4, 427/557, 249.5, 250, 255.18, 255.21, 376.2, 399, 527, 531

[56] References Cited

U.S. PATENT DOCUMENTS

| | | |
|---|---|---|
| 4,474,831 | 10/1984 | Downey . |
| 5,284,800 | 2/1994 | Lien . |
| 5,474,955 | 12/1995 | Thakur ..................................... 437/173 |
| 5,783,493 | 7/1998 | Yeh . |
| 5,789,317 | 8/1998 | Batra . |
| 5,885,896 | 3/1999 | Thakur . |

*Primary Examiner*—Timothy M. Speer
*Attorney, Agent, or Firm*—Reed Smith Shaw & McClay LLP

[57] ABSTRACT

A method of forming a film having enhanced reflow characteristics at low thermal budget is disclosed, in which a surface layer of material is formed above a base layer of material, the surface layer having a lower melting point than the base layer. In this way, a composite film having two layers is created. After reflow, the surface layer can be removed using conventional methods.

10 Claims, 2 Drawing Sheets

METHOD OF FORMING A FILM HAVING ENHANCED REFLOW CHARACTERISTICS AT LOW THERMAL BUDGET

TECHNICAL FIELD

The present invention relates to the fabrication of integrated circuit devices and, more particularly, to a method of forming a film having enhanced reflow characteristics at low thermal budget.

BACKGROUND

A primary goal in the semiconductor industry is high device yields. Manufacturers often must perform certain process steps on substantially planar wafer surfaces to achieve this end. Where manufacturers attempt to perform these process steps on non-planar surfaces, various problems can occur, resulting in a substantial number of inoperable devices and, therefore, low yield. For example, manufacturers must form metal lines on top of a substantially planar surface to ensure continuity over steps at a reduced thermal budget.

Manufacturers frequently use a layer of oxide, such as borophosphosilicate glass ("BPSG"), to planarize the surface of wafers containing advanced dynamic random access memory ("DRAM") structures, which have large stacked capacitor heights and high device density. In one process flow, manufacturers deposit a film superjacent to high-profile device structures. The wafer is then heated to reflow the film. Finally, the wafer is made substantially planar by utilizing a conventional technique, such as chemical mechanical planarization ("CMP").

Reflow is necessary to fill in voids that are created when the film is initially deposited and to smooth the top surface of the film. For reflow to occur, the film must be heated initially to its melting point. Surface tension prevents the film from reflowing even at its melting point. Therefore, the film must be heated even further to overcome the effects of surface tension and, thus, reflow.

However, there are severe limitations on the maximum thermal budget that can be tolerated during the fabrication of state of the art integrated circuit devices. Thermal process steps can cause unwanted diffusion of dopants and destabilization of existing structures. Therefore, manufacturers must carefully restrict the times, temperatures and pressures associated with each thermal process step.

This is particularly true following the source-drain implantation in the manufacture of DRAMs. Reflow of film and activation of source-drain implants are thermal process steps that contribute significantly to the total thermal budget for fabrication of DRAM devices.

For submicron device fabrication, manufacturers are increasingly using rapid thermal processing ("RTP") steps at high temperatures to achieve shallower junctions and reduced diffusion of dopants. Even where RTP reflow steps at high temperature are employed, it is crucial to utilize films having good reflow properties. RTP steps provide process windows of short duration. Films having good reflow properties permit the manufacturer to use narrow process windows for annealing the film to eliminate the effects of moisture, aging and water absorption, which could otherwise cause void formation and segregation.

For these reasons, manufacturers seek films having enhanced reflow properties at low thermal budgets. The reflow properties of certain films at lower thermal budgets can be enhanced through the introduction of specific dopants, such as boron, phosphorous or germanium, into the material forming the film. However, these doped films often exhibit other undesirable film properties when the concentration of dopants is increased. For example, high concentrations of germanium in BPSG film make the film unstable and moisture-sensitive. Also, the germanium can diffuse into a subjacent active region, thereby unintentionally altering device performance.

SUMMARY OF THE INVENTION

The current invention provides a method of forming a film having enhanced reflow properties at low thermal budget, but not exhibiting the above-mentioned drawbacks.

According to the present invention, a surface layer of material is formed above a base layer of material. The materials are chosen such that the surface layer has a lower melting point than the base layer. In this way, a composite film having two layers is created. After reflow, the surface layer can be removed using a conventional technique, such as CMP.

The advantages of the composite film over conventional films are numerous and include the following: (1) The surface tension of the composite film is lower than that of the base layer, if it were used alone, resulting in enhanced reflow characteristics at low thermal budget; (2) no change is required in the basic composition and chemistry of the constituent materials; (3) the etching characteristics of the base layer are not altered; (4) the surface layer can be formed and subsequently removed using conventional process steps; (5) formation and removal of the surface layer can be easily integrated into a conventional process flow; (6) the base layer remains moisture-resistant; and (7) the base layer acts as a diffusion barrier between underlying active regions and any dopants in the surface layer.

DESCRIPTION OF THE PREFERRED EMBODIMENT

Figure 1:
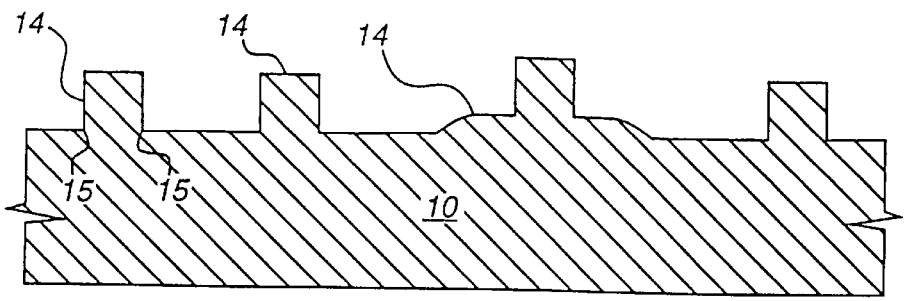
FIG. 1 is a schematic cross-section of a semiconductor substrate on which several high-profile devices have been formed.

Referring to FIG. 1, several high-profile integrated circuit devices have been formed on a substrate 10 to create a device profile 14. Although not to scale, device profile 14 illustrates the high aspect ratios and sharp angles that are characteristic of non-planar semiconductor fabrication technologies, such as stacked cell designs for DRAM arrays.

Figure 2:
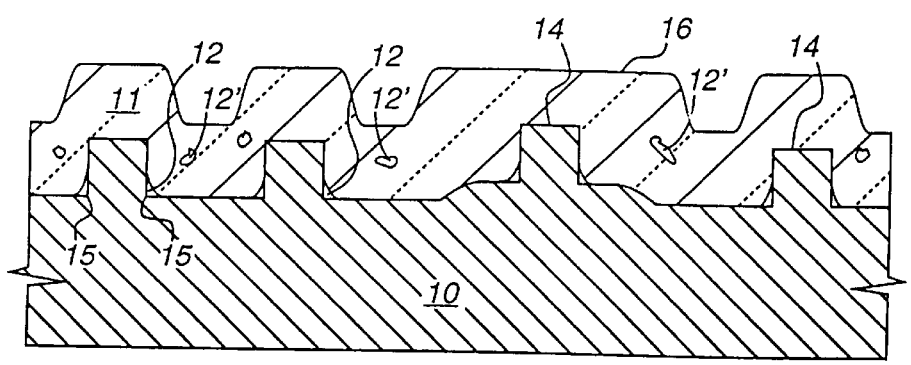
FIG. 2 is a schematic cross-section of the structure resulting from the deposition of a base film superjacent to the substrate depicted in FIG. 1.

Referring to FIG. 2, a film, base layer 11, has been formed superjacent to device profile 14. Preferably, base layer 11 comprises BPSG and has a thickness sufficient to permit subsequent planarization of device profile 14. Generally, base layer 11 can comprise any of a number of materials, including GeBPSG, BPSG, BSG, PSG, SiO2 and organic chemistry film. Further, base layer 11 can be formed by a variety of known techniques, such as plasma enhanced deposition, chemical vapor deposition, low pressure chemical vapor deposition, rapid thermal chemical vapor deposition and sputter deposition.

When base layer 11 is initially formed, it does not perfectly conform to device profile 14. For example, voids 12 exist between base layer 11 and device profile 14. Such voids 12 are especially likely to occur at corners 15 of device profile 14. Moreover, voids 12' exist within base layer 11 itself. Voids 12 and 12' can cause field leakage, decrease reliability by exposing an underlying device structure during or after a subsequent etch step, and have other deleterious effects on device performance and, therefore, yield. Also, upper surface 16 of base layer 11 is not planar at this step in the process.

Figure 3:
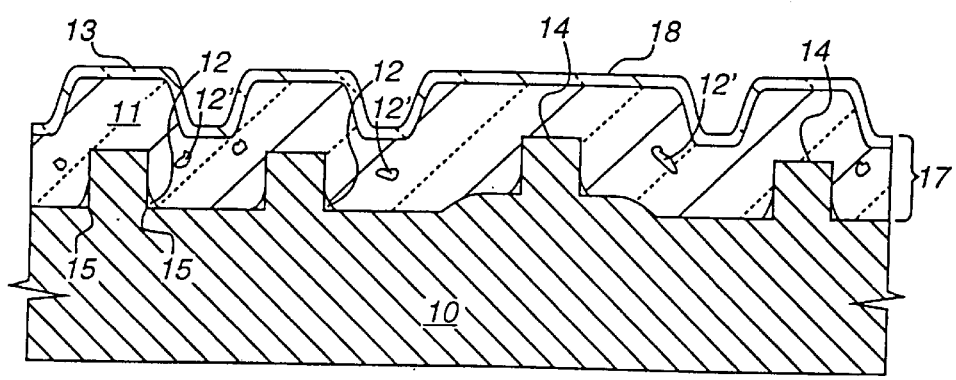
FIG. 3 is a schematic cross-section of the structure resulting from the formation of a surface film superjacent to the base film depicted in FIG. 2.

Referring to FIG. 3, a second film, surface layer 13, has been formed superjacent to base layer 11 to create a composite film 17. Preferably, surface layer 13 lies directly on top of base layer 11. In general, however, one or more intermediate layers may exist between base layer 11 and surface layer 13. An intermediate layer might be introduced for a variety of reasons, such as to act as a diffusion barrier. Constituent layers 11 and 13 are chosen such that the melting point of surface layer 13 is lower than that of base layer 11. Preferably, surface layer 13 comprises GeBPSG and has a thickness of at least 1000 angstroms. Generally, surface layer 13 can comprise any of a number of materials, including GeBPSG having a germanium concentration higher than that of the base layer, BPSG having a boron concentration higher than that of the base layer, BSG having a boron concentration higher than that of the base layer, BPSG having a phosphorous concentration higher than that of the base layer, PSG having a phosphorous concentration higher than that of the base layer and organic chemistry film having a melting point lower than that of the base layer.

So formed, composite film 17 has film properties superior to that of each of its constituent layers 11 and 13, if they alone were used. For example, the surface tension of composite film 17 is lower than that of base layer 11 because surface layer 13 has a lower melting point than base layer 11. Accordingly, film 17 has improved reflow properties over layer 11, if it alone were used. This result is accomplished without changing the basic composition and chemistry of constituent layers 11 and 13. Consequently, the etching characteristics of base layer 11 are not altered. Moreover, surface layer 13 can be formed using any of a variety of conventional process steps described below. After reflow, surface layer 13 can be removed using a conventional process step, as described below. Therefore, formation and removal of surface layer 13 can be easily integrated into a conventional process flow.

Films having superior reflow properties are often moisture-sensitive. By combining a surface layer 13 having superior reflow properties with a base layer 11 that is moisture-resistant; the best characteristics of both films become manifest in composite film 17. The moisture-sensitivity of surface layer 13 is not a concern because the layer can be removed by a subsequent process step in a conventional process flow.

Finally, films having superior reflow properties often contain dopants that will diffuse into subjacent active regions. By combining a surface layer 13 having superior reflow properties with a base layer 11 that contains no dopants or has a relatively low concentration of dopants, the best characteristics of both films become manifest in composite film 17. Dopants in surface layer 13 are less of a concern because base layer 11 acts as a diffusion barrier between subjacent active regions and dopants in surface layer 13. Moreover, surface layer 13 will likely be removed by a subsequent planarization step in a conventional process flow.

Surface layer 13 can be formed in several alternative ways. Preferably, surface layer 13 is formed by implanting a dopant into the top surface of base layer 11. In this manner, a top portion of original base layer 11 becomes surface layer 13. The reflow properties of certain films at lower thermal budgets can be enhanced through the introduction of specific dopants. By implanting such a dopant into a top portion of original base layer 11, the melting point of surface layer 13 is decreased relative to base layer 11. Preferably, the dopant is germanium and surface layer 13 has a thickness of at least 1000 angstroms. However, any one or more of a number of dopants, including boron, phosphorous and germanium could be used. A source of germanium for doping layer 11 would be $GeO_2$.

Suitable implantation processes are known in the art. Generally, when layer 13 is formed by implantation, the thickness of surface layer 13 can be controlled through the energy of the implant, with higher energies resulting in a thicker surface layer 13. Further, the melting point and, therefore, surface tension of surface layer 13 can be controlled through the dose of the implant, with higher doses corresponding to lower melting points. Preferably, the energy is approximately 100 keV and the dose is approximately $1 \times 10^{14}$ to $1 \times 10^{16}$ atoms/cm$^3$.

Alternatively, surface layer 13 could be formed by exposing base layer 11 to a dopant-containing gas, causing the dopant to diffuse into a top portion of base layer 11. For example, a dopant could be introduced into base layer 11 through plasma immersion ion implantation, a process known in the art. Again, the dopant could be any one or more of a number of dopants, including germanium, boron and phosphorous. Dopant-containing gases suitable for this purpose include GeH4 or GeF4 as a germanium source, B2H6 as a boron source and PH3 as a phosphorous source. One advantage of this alternative is that it permits merging the process step of forming surface layer 13 with the process step of reflow. Specifically, the dopant-containing gas could be introduced into the processing chamber where reflow is occurring.

Alternatively, surface layer 13 could be formed by depositing an additional layer of material above base layer 11, with or without intermediate layers of material. Generally, surface layer 13 can comprise any of a number materials, including GeBPSG having a germanium concentration higher than that of the base layer, BPSG having a boron concentration higher than that of the base layer, BSG having a boron concentration higher than that of the base layer, BPSG having a phosphorous concentration higher than that of the base layer, PSG having a phosphorous concentration higher than that of the base layer and organic chemistry film. Further, surface layer 13 can be deposited by a variety of techniques known in the art, such as plasma enhanced deposition, chemical vapor deposition, low pressure chemical vapor deposition, rapid thermal chemical vapor deposition and sputter deposition.

Figure 4:
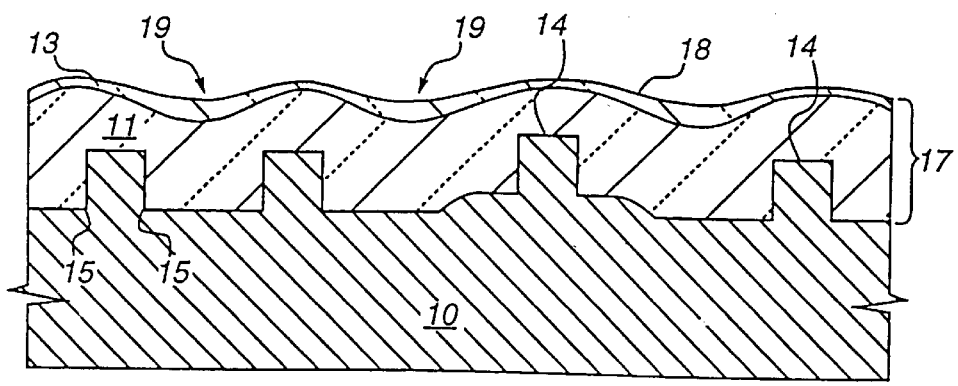
FIG. 4 is a schematic cross-section of the structure resulting from the reflow process as performed on the structure depicted in FIG. 3.

Referring to FIG. 4, a schematic view of composite film 17 after reflow is illustrated. Voids 12 and 12', in FIG. 3, have been eliminated and upper surface 18 of surface layer 13 has been smoothed relative to its state prior to reflow. Surface layer 13 is thicker in low areas 19 of upper surface 18 because the surface layer material tends to flow towards low areas 19 during reflow. Reflow can be accomplished in a number of ways that are known in the art, including RTP and conventional furnace processing. At this point in the process flow, surface layer 13 has served its purpose of reducing the surface tension of composite film 17 during reflow and can, therefore, be treated as a sacrificial film.

Figure 5:
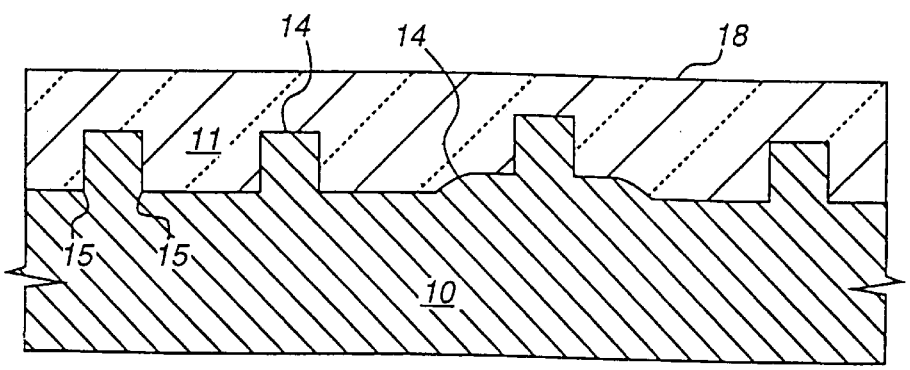
FIG. 5 is a schematic cross-section of the planarized substrate resulting from the application of a conventional planarizing technique, such as chemical mechanical planarization, to the structure depicted in FIG. 4.

Referring to FIG. 5, wafer surface 19 is made substantially planar through the use of a conventional planarizing technique, such as chemical mechanical planarization. In this way, wafer surface 19 is readied for subsequent processing steps. As an added benefit, sacrificial surface layer 13, in FIG. 4, is completely removed if base layer 11 is of sufficient thickness. This planarization step would typically be performed in a conventional process flow utilizing a prior art film. Consequently, the method of the present invention is easily integrated into a conventional process flow.

Although we have illustrated and described a present preferred embodiment of the invention and variations thereon, the invention is not limited thereto but may be embodied otherwise within the scope of the following claims.

We claim:

1. A method of forming a film, comprising the steps of:
   forming a surface layer of material lying above a base layer of material, the surface layer having a lower melting point than the base layer, wherein the step of forming the surface layer comprises the step implanting a top portion of the base layer with a dopant;
   exposing said surface layer and said base layer to radiant energy so as to cause reflow of said surface layer and said base layer,
   removing said surface layer subsequent said reflow.

2. The method of claim 1, wherein the dopant comprises an element selected from the group consisting of germanium, boron and phosphorus.

3. The method of claim 1, wherein the energy of the implant is approximately 100 keV and the dose of the implant is approximately $1 \times 10^{14}$ to $1 \times 10^{16}$ atoms/cm$^3$.

4. The method of claim 1, wherein the step of forming the surface layer comprises the step of depositing the surface layer above the base layer.

5. The method of claim 1, wherein the base layer comprises a material selected from the group consisting of GeBPSG, BPSG, BSG, PSG, and SiO2.

6. A method of forming a film, comprising the steps of:
   forming a surface layer of material lying above a base layer of material, the surface layer having a lower melting point than the base layer, wherein the step of forming the surface layer comprises the step of exposing the base layer to a gas containing a dopant;
   exposing said surface layer and said base layer to radiant energy so as to cause reflow of said surface layer and said base layer,
   removing said surface layer subsequent said reflow.

7. The method of claim 6, wherein the dopant comprises an element selected from the group consisting of germanium, boron and phosphorus.

8. The method of claim 7, wherein reflow is accomplished using rapid thermal processing.

9. The method of claim 7, wherein reflow is accomplished using conventional furnace processing.

10. A method of forming a film, comprising the steps of:
    forming a surface layer of material lying above a base layer of material, the surface layer having a lower melting point than the base layer, wherein the surface layer comprises a material selected from the group consisting of GeBPSG having a germanium concentration higher than that of the base layer, BPSG having a boron concentration higher than that of the base layer, BSG having a boron concentration higher than that of the base layer, BPSG having a phosphorous concentration higher than that of the base layer, and PSG having a phosphorous concentration higher than that of the base layer;
    exposing said surface layer and said base layer to radiant energy so as to cause reflow of said surface layer and said base layer,
    removing said surface layer subsequent said reflow.

* * * * *